United States Patent [19]

Frese et al.

[11] Patent Number: 4,748,413

[45] Date of Patent: May 31, 1988

[54] STRUCTURE FOR HOMOGENIZING THE FUNDAMENTAL FIELD IN A NUCLEAR MAGNETIC RESONANCE EXAMINATION APPARATUS

[75] Inventors: Georg Frese; Karl-Georg Ladwein, both of Erlangen, Fed. Rep. of Germany

[73] Assignee: Siemens Aktiengesellschaft, Berlin and Munich, Fed. Rep. of Germany

[21] Appl. No.: 926,226

[22] Filed: Nov. 3, 1986

[30] Foreign Application Priority Data

Nov. 12, 1985 [DE] Fed. Rep. of Germany ....... 3540080

[51] Int. Cl.[4] ............................................. G01R 33/20
[52] U.S. Cl. .................................... 324/318; 324/300
[58] Field of Search ............... 324/300, 307, 318, 319, 324/320; 335/216, 299, 304, 306

[56] References Cited

U.S. PATENT DOCUMENTS

| | | | |
|---|---|---|---|
| 4,240,439 | 12/1980 | Abe et al. | 128/653 |
| 4,374,360 | 2/1983 | Sepponen | 324/309 |
| 4,612,505 | 9/1986 | Zijlstra | 324/318 |
| 4,631,481 | 12/1986 | Young et al. | 324/320 |
| 4,639,673 | 1/1987 | Zijlstra | 324/318 |

FOREIGN PATENT DOCUMENTS 3333755 4/1985 Fed. Rep. of Germany .
2549281 1/1985 France .
57-171358 4/1984 Japan .

OTHER PUBLICATIONS

"Surface Coils to Improve the Homogeneity of a Given Magnet," Czok et al, Nucl. Instr. and Method. 140 (1977), pp. 39–45.

"A Method for Improving the Quality of the Magnetic Field in a Solenoid," Feinberg et al, Nucl. Instr. and Meth. 203 (1982) pp. 81–85.

Primary Examiner—Stewart J. Levy
Assistant Examiner—Kevin D. O'Shea
Attorney, Agent, or Firm—Hill, Van Santen, Steadman & Simpson

[57] ABSTRACT

A structure for homogenizing the fundamental field in a nuclear magnetic resonance examination apparatus has a plurality of rods consisting at least partially of ferromagnetic material and a structure for supporting the rods in the fundamental magnetic field. The supporting structure may be in the form of rings with the rods extending therethrough at selected positions, either individually or in groups. The location, cross-section, length, shape and number of rods are selected as needed for homogenizing the fundamental field.

17 Claims, 2 Drawing Sheets

4,748,413

STRUCTURE FOR HOMOGENIZING THE FUNDAMENTAL FIELD IN A NUCLEAR MAGNETIC RESONANCE EXAMINATION APPARATUS

BACKGROUND OF THE INVENTION

1. Field of the Invention

The present invention relates to nuclear magnetic resonance devices for examining a subject by inducing and measuring magnetic resonance signals in the patient, and in particular to a means for homogenizing the fundamental magnetic field in such an apparatus.

2. Description of the Prior Art

A basic nuclear magnetic resonance tomograph apparatus is described in U.S. Pat. No. 3,564,398 which includes respective sets of coils for generating fundamental and gradient magnetic fields in which an examination subject is disposed, a radio-frequency means for applying RF pulses to the subject and for acquiring the nuclear magnetic resonance signals resulting from the pulses from the subject. This apparatus is suitable for exciting hydrogen atom nuclei of the examination subject and for displaying the proton distribution of a selected slice of the subject. It is necessary that disturbances which occur in the fundamental field be corrected in order to obtain good image quality. A number of current-permeated correction coils, referred to as shim coils, are provided for the purpose of homogenizing the fundamental field.

SUMMARY OF THE INVENTION

It is an object of the present invention to provide a means for homogenizing the fundamental magnetic field in a nuclear magnetic resonance examination apparatus which means does not require the use of additional currents.

The above object is achieved in accordance with the principles of the present invention by a plurality of rods, each rod at least partially consisting of ferromagnetic material and means for supporting the rods in the fundamental magnetic field of the apparatus. The rods are disposed individually or in groups by the support means at selected locations, which in combination with selected cross-section, length, shape and number of rods homogenize the fundamental field.

The structure disclosed in the present application thus permits the fundamental magnetic field to be homogenized without the use of shim coils, or at least with a substantially reduced number of such shim coils.

Dependent upon requirements for individual devices, the rods have ferromagnetic properties in at least one region thereof. Due to the fundamental field, a magnetization of the rod material is effected in these regions, which in turn results in a corrective influence on the fundamental field. By a suitable combination of rods of this type, which can also differ in length and diameter, a good field homogenization can be achieved.

For homogenization in the x-direction, the y-direction and the z-direction, the rods extending along the longer sides of the examination room can be attached parallel to the longitudinal cylinder direction and/or can be attached in the shape of a star to one of the end walls of the apparatus. If magnetic returns as described, for example, in German Patent Application No. P33 33 755.1 are disposed at the outside of the coils, compensation of the field disturbances generated by these magnetic returns is possible by attaching the rods to the surface of a plastic tube which surrounds the examination space.

DESCRIPTION OF THE PREFERRED EMBODIMENTS

Figure 1:
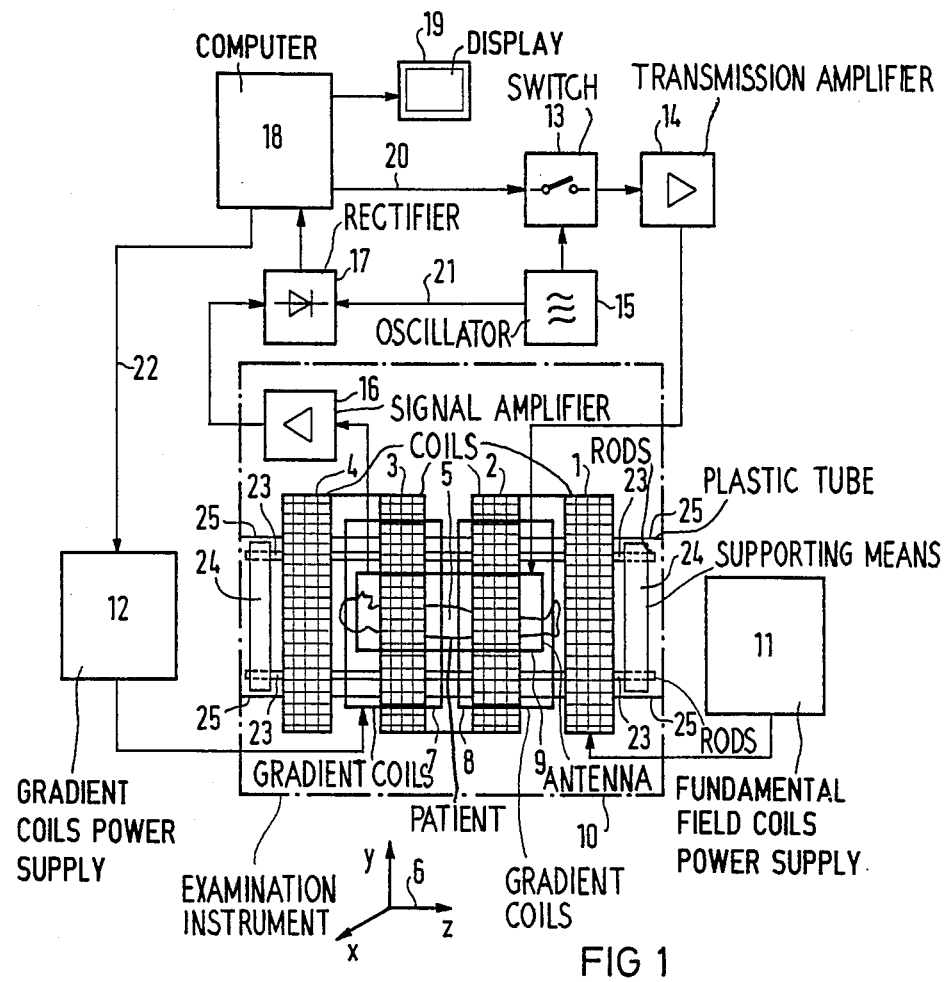
FIG. 1 is schematic block diagram of a nuclear magnetic resonance tomography apparatus employing a field homogenization means constructed in accordance with the principles of the present invention.

A basic circuit diagram of a nuclear magnetic resonance tomograph apparatus of the type in which the fundamental field homogenization means disclosed herein can be embodied, is shown in FIG. 1. The apparatus includes coils 1, 2, 3 and 4 operated by a power supply 11 for generating a fundamental magnetic field in which a patient 5 to be examined is disposed. A plurality of coils are also provided for generating orthogonal magnetic field gradients in the directions indicated by the set of axes 6. For clarity, only gradient coils 7 and 8 are shown in FIG. 1, which generate an x-gradient. Identical y-gradient coils (not shown) are disposed parallel to the patient 5 above and below the patient 5. Coils for generating the z-gradient are disposed at right angles relative to the longitudinal axis of the patient 5 at the head and feet of the patient 5. The gradient coils are operated by a power supply 12. The apparatus also includes an antenna or other suitable coil 9 for inducing nuclear magnetic resonance signals in the patient 5, and for picking up the resulting nuclear magnetic resonance signals.

The components 1 through 9 bounded by the dot-dash line 10 constitute the actual examination instrument in which the patient is disposed. Other components of the device, which can be disposed remote from the examination unit, include a high-frequency oscillator 15 which feeds the antenna 9 through a switch 13 and a transmission amplifier 14. The output of the oscillator 15 is also supplied to a computer 18 in combination with the signals received by the antenna 9, which are supplied through a signal amplifier 16 and a phase-sensitive rectifier 17. The computer 18 combines the signals in a known manner and constructs an image of a selected slice of the patient 5, which can be viewed on a display unit 19. The computer 18 also controls operation of the switch 13 by a signal provided on line 20, and controls operation of the gradient coils power supply 12 by a signal on a line 22.

In accordance with the present invention, means are provided within the fundamental magnetic field generated by the coils 1, 2, 3 and 4 for homogenizing this field. This means includes one or more rods 23 each consisting at least partially of ferromagnetic material, and means 24 for supporting the rods 23 at selected locations. The support means 24 may be a plurality of tension rings with holes therein for receiving the rods 23, the rings 24 being disposed perpendicular to the z-axis. For clarity, only two such rings 24 and two rods 23 are shown in FIG. 1. The rings 24 may be attached to the jacket of a plastic tube 25 surrounding the examination space.

Figure 2:
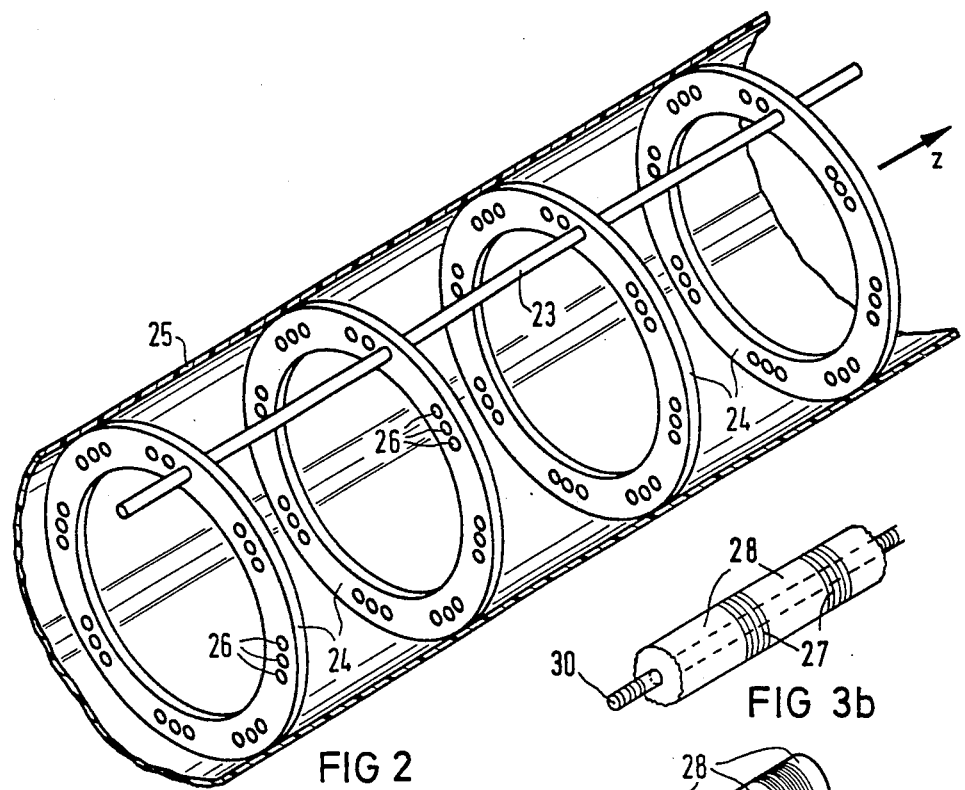
FIG. 2 is a perspective view, partly broken away, of a supporting structure and one rod for the field homogenization means constructed in accordance with the principles of the present invention.

The homogenization means is shown in greater detail in FIG. 2. As can be seen, the rings 24 attached to the plastic tube 25 are provided with a plurality of holes 26 therein. The holes are disposed at equidistant locations around the circumference of the rings 24 so that individual rods 23 or groups of rods 23 can be inserted therethrough. The size of the holes 26 is selected to match the diameter of the rods 23. The specific location of the holes 26, the diameters of the holes and spacings thereof, as well as the cross-section, diameter, length and number of the rods 23, are selected to achieve an optimum homogenization of the fundamental field for the particular apparatus in which the structure is to be employed.

Alternatively, the tension rings 24 may be attached to the outside of the plastic tube 25. The rods may, as a further alternative, be attached to the outside jacket of the coils 1, 2, 3 and 4 for generating the fundamental magnetic field.

Figure 3B:
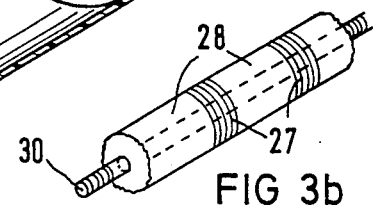
FIG. 3b shows another embodiment for joining sections of different magnetic materials to form one of the rods.
Figure 3:
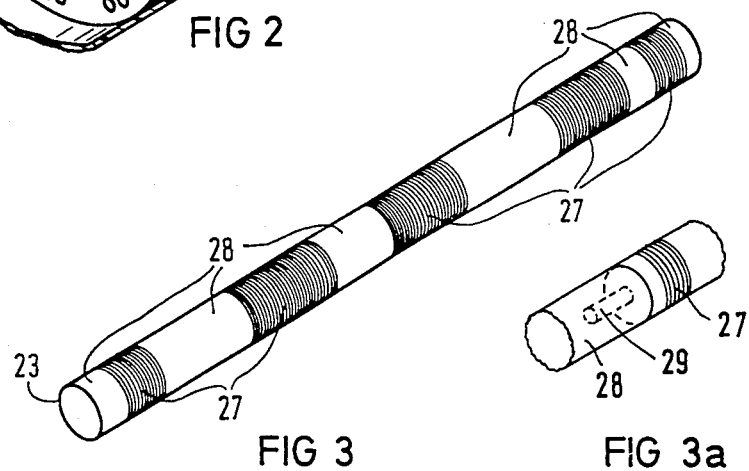
FIG. 3 shows one embodiment of a rod for use in the field homogenization means constructed in accordance with the principles of the present invention.

One embodiment of a rod 23 is shown in detail in FIG. 3. The rod 23 has alternating regions 27 having ferromagnetic properties and regions 28 of non-magnetic material along the longitudinal axis thereof. The fundamental magnetic field can be homogenized by suitable selection of the spacings and lengths of these regions. The rod 23 may be alternatively constructed in the form of a non-magnetic tube which is successively filled with materials having different magnetic properties. The boundaries between the materials of different magnetic properties need not necessarily be sharp, but may be diffused into each other so that the different properties merge or flow together in a transition region.

Figure 3A:
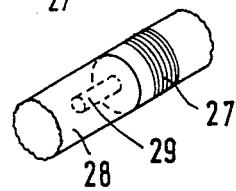
FIG. 3a shows a portion of a further embodiment of a rod showing details of the connection between ferromagnetic and non-magnetic portions of the rod.

One embodiment for connecting regions 27 and 28 of different magnetic properties together is shown in FIG. 3a, wherein one of the regions, such as the region 27, is provided with a threaded projection 29 consisting of non-magnetic material, which is received in a correspondingly threaded bore in the region 28. In another variation of this embodiment shown in FIG. 3b, a small diameter threaded non-magnetic bolt 30 may extend along the full longitudinal length of the rod 23, with the individual portions or sub-rods consisting of material having different magnetic properties each having a centrally disposed complementary threaded bore therein so that the sub-rods can be threaded in succession on the small-diameter bolt 30 to form the rod 23.

Although other modifications and changes may be suggested by those skilled in the art it is the intention of the inventors to embody within the patent warranted hereon all changes and modifications as reasonably and properly come within the scope of their contribution to the art.

We claim as our invention:

1. In a nuclear magnetic resonance apparatus for examining a subject having means for generating a fundamental magnetic field in which said subject is disposed, means for generating a plurality of gradient fields in which said subject is also disposed, and means for generating and measuring nuclear magnetic resonance signals in said subject, the improvement comprising:
   a plurality of rods at least partially consisting of ferromagnetic material; and
   means for supporting said rods in said fundamental magnetic field at respective locations selected in combination with the cross-section, shape, length and number of said rods for homogenizing said fundamental magnetic field.

2. The improvement of claim 1, wherein said means for supporting said rods consists of a plurality of rings, each ring having a plurality of holes therein disposed in registry with holes in the other rings for receiving said rods.

3. The improvement of claim 2, wherein said apparatus further includes a cylinder surrounding an examination space in which said subject is disposed, and wherein said rings are attached to said cylinder.

4. The improvement of claim 3, wherein said rings are attached to an exterior of said cylinder.

5. The improvement of claim 3, wherein said rings are attached to an interior of said cylinder.

6. The improvement of claim 2, wherein said means for generating a fundamental magnetic field includes a plurality of coils and an outside jacket surrounding said coils, and wherein said rings are attached to said outside jacket.

7. The improvement of claim 1, wherein said means for supporting said rods supports said rods at equidistant spacings.

8. The improvement of claim 1, wherein said means for supporting said rods supports said rods in groups.

9. The improvement of claim 8, wherein said means for supporting said rods support said rods in groups with said groups being equidistantly spaced.

10. The improvemnt of claim 1, wherein said rods in said plurality of rods have different diameters.

11. The improvement of claim 1, wherein said rods each consist of a plurality of longitudinally extending regions having different magnetic properties.

12. The improvement of claim 11, wherein said regions having different magnetic properties are diffused into each other in a transition between said regions.

13. The improvement of claim 11, wherein said regions are formed by a plurality of alternating sub-rods having different magnetic properties joined together longitudinally.

14. The improvement of claim 13, wherein said sub-rods are joined together by a threaded projection carried on each sub-rod which is received in a complementary threaded bore in an adjacent sub-rod.

15. The improvement of claim 13, wherein said sub-rods are joined together by a threaded bolt, and wherein each sub-rod has a centrally disposed threaded bore therein for receiving threaded bolt.

16. The improvement of claim 1, wherein said rods each consist of a tube of non-magnetic material at least partially filled with magnetic material.

17. In a nuclear magnetic resonance apparatus for examining a subject having means for generating a fundamental magnetic field in which said subject is disposed, means for generating a plurality of gradient fields in which said subject is also disposed, and means for generating and measuring nuclear magnetic signals in said subject, the improvement comprising:
   a plurality of rods at least partially consisting of ferromagnetic material; and
   a plurality of spaced rings disposed surrounding said subject and perpendicular to a longitudinal axis of said subject, each ring having a plurality of holes therein for receiving said rods substantially parallel to said longitudinal axis, said holes being disposed at locations selected in combination with the cross-section, shape, length and number of said rods for homogenizing said magnetic field.

* * * * *